United States Patent [19]

Ong

[11] 4,288,764
[45] Sep. 8, 1981

[54] SIGNAL PROCESSING DEVICES

[75] Inventor: Lip H. Ong, Birmingham, England

[73] Assignee: The Secretary of State for Defence in Her Britannic Majesty's Government of the United Kingdom of Great Britain and Northern Ireland, London, England

[21] Appl. No.: 87,609

[22] Filed: Oct. 23, 1979

[30] Foreign Application Priority Data

Oct. 25, 1978 [GB] United Kingdom ............... 41849/78
Nov. 15, 1978 [GB] United Kingdom ............... 44568/78

[51] Int. Cl.³ .................... H03K 5/159; G11C 19/28; H03H 17/08; H03H 11/36
[52] U.S. Cl. ............................. 333/165; 307/221 D; 333/166
[58] Field of Search ............... 333/165, 166, 138–140; 307/221 R, 221 C, 221 D, 293; 357/24; 73/609–625; 328/104, 109, 110, 133

[56] References Cited

U.S. PATENT DOCUMENTS 4,152,678 5/1979 Shott et al. ..................... 333/165 X Primary Examiner—Marvin L. Nussbaum
Attorney, Agent, or Firm—Pollock, Vande Sande & Priddy

[57] ABSTRACT

A time delay and integrate signal processing device is provided to which, in use, a clock signal having a duty cycle which varies linearly with time at a predetermined rate is applied at an input. The number of delay stages in the path of signals from a plurality of input taps is determined in accordance with a predetermined function of the rate of change of the clock duty cycle.

Embodiments of the invention may be employed to advantage in SONAR applications where signals are received from a plurality of transducers to scan a sector by constructive summation of signal returns. The predetermined function may be chosen to minimize distortion during a scan and so scanning may take place at a higher rate than with prior art devices enabling full coverage of the sector with good range resolution to be achieved with a single device.

2 Claims, 2 Drawing Figures

SIGNAL PROCESSING DEVICES

This invention relates to signal processing devices.

Recently, integrated electronic devices have been developed in which an analogue sample of an input signal is transferred from one stage of a device to an adjacent stage in response to clock pulses synchronously applied to all stages of the device. By careful choice of signals applied to clock electrodes on the device this transfer may be unidirectional and the device behaves as a sampling analogue delay line. The internal mechanisms of sample transfer has resulted in the name Charge Coupled Device (CCD), for this type of device.

A multiple input device may be constructed along these lines by introducing a separate input tap at each stage of the device. A signal sample from the first input tap undergoes a one stage delay before being summed with a sample from the second input tap. This sum is likewise delayed before being summed with a sample from the third input tap. This mechanism continues along the device, resulting in a single output which represents the sum of input samples which have been clocked into the device at different times in the past. Hence, the number of delay stages in the path of signals from each input tap varies linearly across the device. A device of this type is referred to in the art as a Time Delay and Integrate (TDI) device.

The usefulness of TDI devices has been investigated in many applications, including the reception of a plurality of signals from an array of transducers spaced apart, such as for example a SONAR array.

In SONAR a pulse is transmitted from an underwater transducer and reflections of the pulse are received by a suitably disposed array of receiver transducers. These signals are processed and may be interpreted to yield information about the environment around the transducers. Generally the receiver peak response is swept over a sector so that maximum coverage is achieved, however targets may be lost if the scan rate is too low. Theoretically the sector must be scanned at least once within each transmitted pulse if no target is to be lost.

It has been found that signals derived from a linear array of transducers may be advantageously applied to the input taps of a TDI. If the time delay between reception of a given wavefront arriving at a particular angle of incidence at adjacent transducers is equal to the period of the TDI clock, constructive summation of the incoming signals occurs at each stage of the device. In this way, the angle of look of the transducer array is determined by the TDI clock frequency. If the TDI clock duty cycle is varied, different angles may be interrogated and the receiver peak response swept to scan a sector. Unfortunately, when the pulse width is made sufficiently short to achieve good range resolution, the high scanning rate then required cannot be achieved without severe distortion of the received beam pattern. Full coverage can only be obtained by considering a very restricted sector or by operating a plurality of TDI devices in parallel each clocked at a different frequency to cover a different direction.

According to the present invention there is provided a signal processing device having input taps for receiving a plurality of signals and having delay stages in the path of signal samples from each input tap arranged such that signal samples may be transferred from one stage to the next in response to a clock signal applied at a clock input to which, in use, a clock signal having a duty cycle which varies linearly with time at a predetermined rate is applied, wherein the number of stages in the path of signals from each input tap is determined in accordance with a predetermined function of the rate of change of the clock duty cycle.

For convenience a signal processing device in accordance with the present invention will hereinafter be referred to as a Non-Uniform Time Delay and Integrate (NUTDI) device.

In order that features of the present invention and its advantages may be better appreciated, embodiments will now be described, by way of example only, with reference to the accompanying diagrammatic drawings of which:

Figure 1:
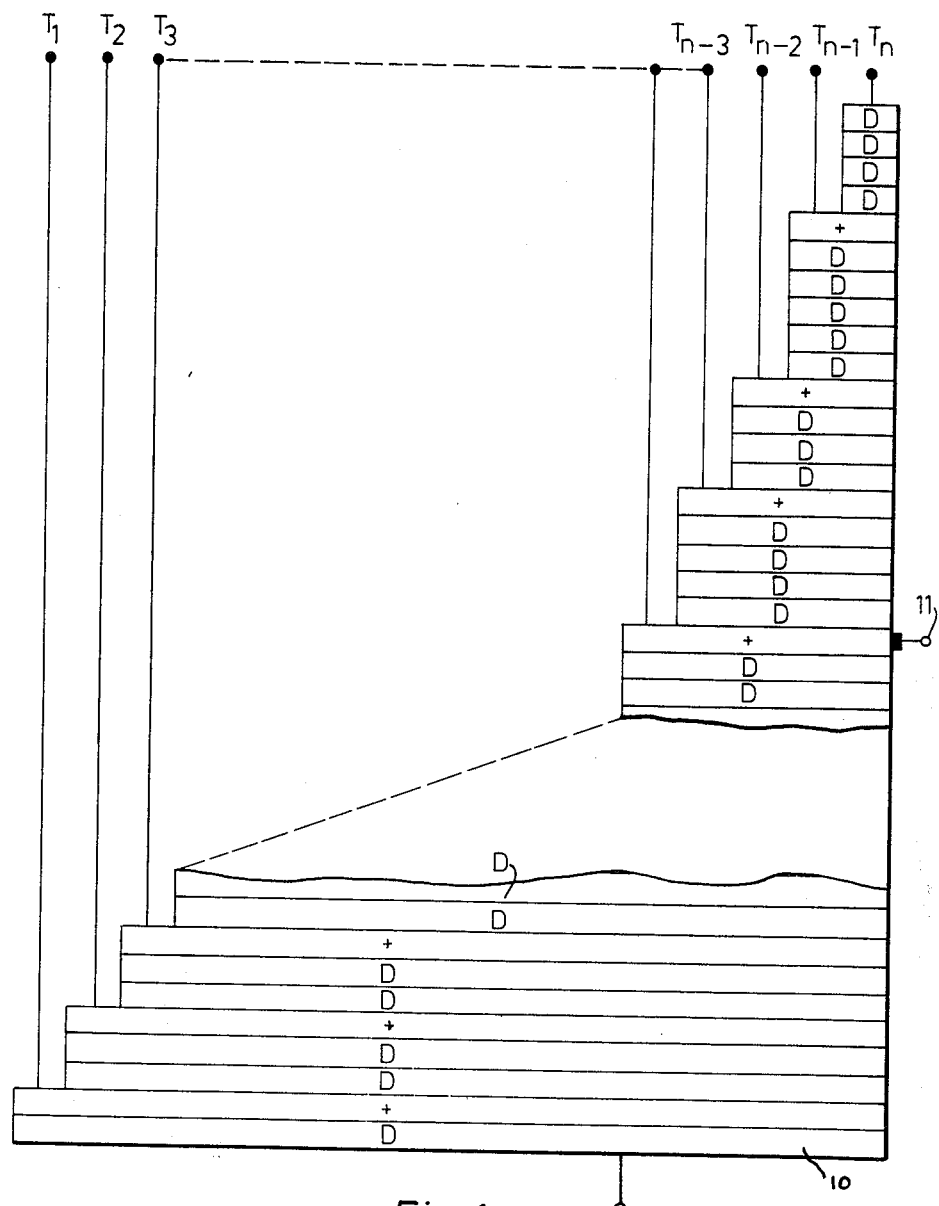
FIG. 1 represents a NUTDI device.

A NUTDI 10 in accordance with the present invention (FIG. 1) receives signals at a plurality of inputs $T_1$, $T_2$, ..., $T_n$. Signals from each input are connected in order to respective input taps on the NUTDI 10. The delay and summation of signal samples is shown diagrammatically in FIG. 1, being a representation of a possible electrode structure of an NUTDI Charge Coupled Device fabrication. Delays of one duty cycle are represented by blocks labelled D in FIG. 1 and summation within the device by blocks labeled +.

The number of delay stages in each signal path is determined in accordance with a predetermined function of the rate of change of the duty cycle of a clocking signal which is applied to clock input 11. In one embodiment of the present invention the number of delay stages, $x_n$, in the path of signals from the $n^{th}$ input is determined by the function:

$$x_n = \frac{\log\left(\frac{(1+r)}{(1+r) - r(n-1)}\right)}{\log(1+r)} + 1$$

where r is the rate of change of the clock duty-cycle.

In general values of $x_n$ determined in accordance with the above will not be integers. However for some applications, correction to the nearest integer value may be satisfactory. For higher performance the approximation to $x_n$ may be improved by using a minimum difference of more than one in the number of delay stages in the path of signals from adjacent input taps and clocking the device at a correspondingly higher frequency. The number of delay stages, $x_n$, in the path of signals from the $n^{th}$ input may then be determined by the function:

$$x_n = \frac{\log\left(\frac{(1+r)^\alpha}{(1+r)^\alpha - (n-1)[(1+r)^\alpha - 1]}\right)}{\log(1+r)} + 1$$

where $\alpha$ is the desired minimum number of delay stages between input taps and r is the rate of change of clock duty-cycle.

In order to ensure unidirectional transfer of signal samples within a CCD, it is known in the art to employ a three phase clocking arrangement. The clock phases are derived from a master oscillator running at three times the phase clock duty-cycle. Each delay stage of the device includes an electrode connected to each clock phase and by careful positioning of these electrodes unidirectional transfer is achieved.

In a NUTDI device employing a multi-phase clock, the approximation to $x_n$ above may be further improved by sampling each signal on an appropriately chosen clock phase. This may be achieved by incorporation of additional electrodes of the appropriate phase at each input tap of the device. In this way approximation errors may be limited to $+1/6$ of the phase clock period, for a three phase clock arrangement.

It will be appreciated by those skilled in the art that using the NUTDI device the clock duty cycle may be varied periodically to facilitate scanning. It will further be appreciated that the rate of change of the clock duty cycle may be made fast enough for within pulse scanning at typical SONAR frequencies without the severe distortion of beam patterns encountered with prior art devices. As an example, the operation of a TDI in accordance with the present invention will now be described in a typical application.

Figure 2:
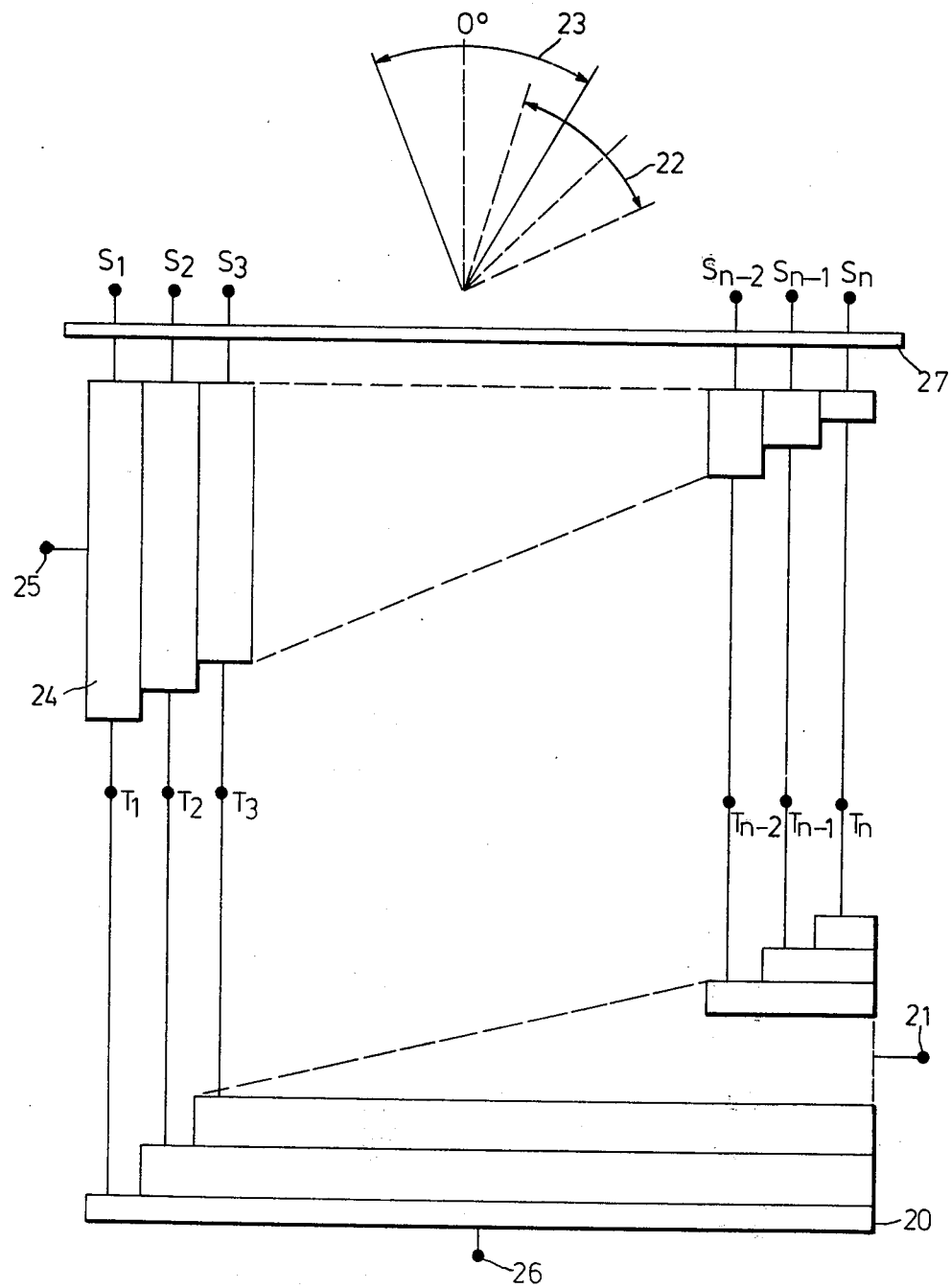
FIG. 2 represents a NUTDI device, time wedge device and receiver transducers arranged to scan a sector.

A NUTDI device in accordance with the present invention 20 (FIG. 2) receives signals at input taps $T_1, \ldots, T_n$ derived from an array of SONAR transducers $S_1, \ldots, S_n$. A clock signal whose duty cycle varies linearly with time is applied to the clock input 21. The rate of change of clock duty cycle is chosen such that a 30° sector may be scanned with a 1° beam width within each transmitted SONAR pulse. An output may be obtained from the device at 26.

It will be realized that a build up time exists during which the output from the device 20 is not properly constituted. This build up time corresponds to the time taken for a signal sample to traverse the total number of delay stages. In order to minimize build up time the clock signal is swept from short to long duty-cycles. Additionally the range of clock duty cycles may be arranged such that improperly constituted outputs relate to angles outside the desired sector.

A short duty cycle results in interrogation of an angle close to the boresight direction (0°). It will be realized that for any practical device a minimum operating clock duty cycle exists resulting in a minimum angle of look.

Thus, using the device 20 alone, only an off boresight sector 22 may be covered. In order to scan a sector 23 which includes the boresight direction a linear delay wedge 24 is included. The delay wedge 24 is preferably a series of n parallel delay lines of incrementally varying length to which a constant periodic clock is synchronously applied via an input 25. Signal conditioning circuitry 27 is included between transducers $S_1, S_2, \ldots, S_n$ and the time delay wedge 24.

Computer simulation has demonstrated that substantially undistorted beam patterns are obtained at a scanning rate of 8 kHz for a 32 element transducer array scanning a 30° sector with a 1° beam width at a SONAR frequency of 500 kHz.

For a very high performance system the remaining distortion may be improved by amplitude weighting of the signals sampled at each summation and phase compensation may be included to eliminate approximation errors for the boresight direction.

It will be appreciated that the present invention is equally applicable to passive SONAR in which a sector is scanned for radiation within a predetermined band width. In this case the scanning rate (and thereby the rate of change of TDI clock duty cycle) is determined by the inverse of the band width required.

It will be further appreciated that NUTDI in accordance with the present invention may be employed to process signals from a 2-Dimensional transducer array.

It will be realized by those skilled in the art that a signal processing device embodying the present invention may be constructed for high frequency use, such as for example RADAR and ultrasonic scanning.

What I claim is:

1. A signal processing device comprising a plurality of input taps, a plurality of delay stages, and a clock signal input, said input taps being arranged to receive a plurality of signals, said delay stages being arranged in the path of signals from each input tap such that signal samples may be transferred from one stage of said delay stages to another stage of said delay stages in response to a clock signal applied at said clock signal input, said clock signal, in use, having a duty cycle which varies linearly with time at a predetermined rate, and the number of said stages in the path of said signals from each of said input taps being determined in accordance with the predetermined function:

$$x_n = \frac{\log\left(\frac{(1+r)}{(1+r) - r(n-1)}\right)}{\log(1+r)} + 1$$

where n is the number of input taps, $x_n$ is the number of delay stages in the path of signals from the nth input tap, and r is the rate of change of the clock duty cycle.

2. A signal processing device comprising a plurality of input taps, a plurality of delay stages, and a clock signal input, said input taps being arranged to receive a plurality of signals, said delay stages being arranged in the path of signals from each input tap such that signal samples may be transferred from one stage of said delay stages to another stage of said delay stages in response to a clock signal applied at said clock signal input, there being a minimum difference of more than one in the number of delay stages in the path of signals from adjacent input taps, said clock signal, in use, having a duty cycle which varies linearly with time at a predetermined rate, and the number of said stages in the path of said signals from each of said input taps being determined in accordance with the predetermined function:

$$x_n = \frac{\log\left(\frac{(1+r)^\alpha}{(1+r)^\alpha - (n-1)[(1+r)^\alpha - 1]}\right)}{\log(1+r)} + 1$$

where n is the number of input taps, $X_n$ is the number of delay stages in the path of signals from the nth input tap, r is the rate of change of the clock duty cycle, and $\alpha$ is the desired minimum number of delay stages between input taps.

* * * * *